US009743769B2

(12) United States Patent
Prasad et al.

(10) Patent No.: US 9,743,769 B2
(45) Date of Patent: Aug. 29, 2017

(54) ENTERTAINMENT DISPLAY MOUNT

(71) Applicant: PANASONIC AVIONICS CORPORATION, Lake Forest, CA (US)

(72) Inventors: Birendra Prasad, Tustin, CA (US); Shrenik Shah, Laguna Niguel, CA (US)

(73) Assignee: PANASONIC AVIONICS CORPORATION, Lake Forest, CA (US)

( * ) Notice: Subject to any disclaimer, the term of this patent is extended or adjusted under 35 U.S.C. 154(b) by 4 days.

(21) Appl. No.: 14/879,921

(22) Filed: Oct. 9, 2015

(65) Prior Publication Data

US 2017/0099948 A1 Apr. 13, 2017

(51) Int. Cl.
*A47B 97/00* (2006.01)
*H05K 7/14* (2006.01)

(52) U.S. Cl.
CPC ............ *A47B 97/001* (2013.01); *H05K 7/14* (2013.01)

(58) Field of Classification Search
None
See application file for complete search history.

(56) References Cited

U.S. PATENT DOCUMENTS

| 2,825,152 | A | | 3/1958 | Baylon | |
|---|---|---|---|---|---|
| 5,333,416 | A | | 8/1994 | Harris et al. | |
| 5,842,672 | A | * | 12/1998 | Sweere | A47B 21/00 248/278.1 |
| 5,924,665 | A | * | 7/1999 | Sweere | A47B 21/00 248/278.1 |
| 6,478,275 | B1 | * | 11/2002 | Huang | F16M 11/08 248/278.1 |
| 6,712,321 | B1 | * | 3/2004 | Su | F16M 11/105 248/123.11 |
| D489,370 | S | * | 5/2004 | Jobs | D14/337 |

(Continued)

FOREIGN PATENT DOCUMENTS

WO  WO 2016203116  12/2016

OTHER PUBLICATIONS

European Patent Office, Extended European Search Report, dated Feb. 3, 2017, 7 pages, Munich, Germany.

*Primary Examiner* — Xanthia C Cunningham
(74) *Attorney, Agent, or Firm* — Stetina Brunda Garred & Brucker

(57) ABSTRACT

A mount assembly for dynamically positioning a display to a mounting surface. The assembly comprises a base support frame and a pivoting support frame pivotally coupled thereto and defining a pivot angle in between, with the pivoting support frame being transitional between first and second positions, the pivot angle increasing as the pivot support frame transitions from the first position toward the second position. A carriage frame adapted to be engaged with the display, and having a first attachment portion is pivotally and translatably coupled to the base support frame and defines a carriage angle therebetween, and a second attachment portion is pivotally coupled to the pivoting support frame. The carriage frame is transitional relative to the base support frame between stowed and deployed positions, the carriage angle increasing as the carriage transitions from the stowed position to the deployed position.

20 Claims, 5 Drawing Sheets

(56) References Cited

U.S. PATENT DOCUMENTS

| | | | | |
|---|---|---|---|---|
| 6,857,610 B1* | 2/2005 | Conner | | F16M 11/14 248/284.1 |
| 7,296,774 B2* | 11/2007 | Oh | | F16M 11/08 248/324 |
| 7,490,804 B2* | 2/2009 | Oh | | F16M 11/10 248/278.1 |
| 7,567,436 B2* | 7/2009 | Jeong | | F16M 11/10 16/221 |
| 7,854,415 B2* | 12/2010 | Holbrook | | F16M 11/10 248/125.2 |
| 8,076,889 B2* | 12/2011 | Lai | | F16M 11/08 248/278.1 |
| 8,130,488 B2* | 3/2012 | Sawai | | F16M 11/10 16/54 |
| 8,724,037 B1* | 5/2014 | Massey | | H04N 5/655 348/836 |
| 8,896,242 B2* | 11/2014 | Flessas | | G06F 1/1601 318/101 |
| 9,277,812 B2* | 3/2016 | Bennett | | A47B 81/00 |
| 9,320,138 B2* | 4/2016 | Lee | | H05K 5/03 |
| 9,551,453 B2* | 1/2017 | Walters | | F16M 11/08 |
| 2004/0075639 A1* | 4/2004 | Lester | | B60R 11/0235 345/156 |
| 2004/0155167 A1* | 8/2004 | Carter | | F16M 11/08 248/324 |
| 2004/0262474 A1* | 12/2004 | Boks | | F16M 11/041 248/276.1 |
| 2005/0088814 A1* | 4/2005 | Jobs | | F16M 11/14 361/679.06 |
| 2005/0179618 A1* | 8/2005 | Oh | | F16M 11/08 345/7 |
| 2006/0171105 A1* | 8/2006 | Hsiao | | G06F 1/1601 361/679.06 |
| 2006/0238661 A1* | 10/2006 | Oh | | F16M 11/18 348/825 |
| 2007/0053151 A1* | 3/2007 | Capoferri | | F16M 11/10 361/679.21 |
| 2007/0096606 A1* | 5/2007 | Ryu | | F16M 11/08 312/7.2 |
| 2007/0204499 A1 | 9/2007 | Sudak et al. | | |
| 2007/0252059 A1* | 11/2007 | Katsumata | | H04N 9/3141 248/278.1 |
| 2007/0252919 A1 | 11/2007 | McGreevy | | |
| 2007/0266607 A1 | 11/2007 | Schult | | |
| 2008/0029661 A1* | 2/2008 | Chen | | F16M 11/105 248/176.1 |
| 2008/0100997 A1* | 5/2008 | Chen | | G06F 1/1601 361/679.01 |
| 2009/0008349 A1* | 1/2009 | Kim | | G06F 1/1607 211/150 |
| 2009/0101047 A1 | 4/2009 | Mulaw et al. | | |
| 2012/0314343 A1* | 12/2012 | Ochoa | | F16M 11/10 361/679.01 |
| 2012/0325985 A1* | 12/2012 | Slowinski | | F16M 11/08 248/121 |
| 2013/0038991 A1* | 2/2013 | Fang | | F16M 13/02 361/679.01 |
| 2014/0085783 A1* | 3/2014 | Li | | F16M 11/10 361/679.01 |
| 2015/0192966 A1* | 7/2015 | Kim | | G06F 1/1681 361/679.28 |
| 2015/0250315 A1* | 9/2015 | Gross | | F16M 11/10 361/679.01 |
| 2015/0354746 A1* | 12/2015 | Hung | | F16M 11/18 211/26 |

* cited by examiner

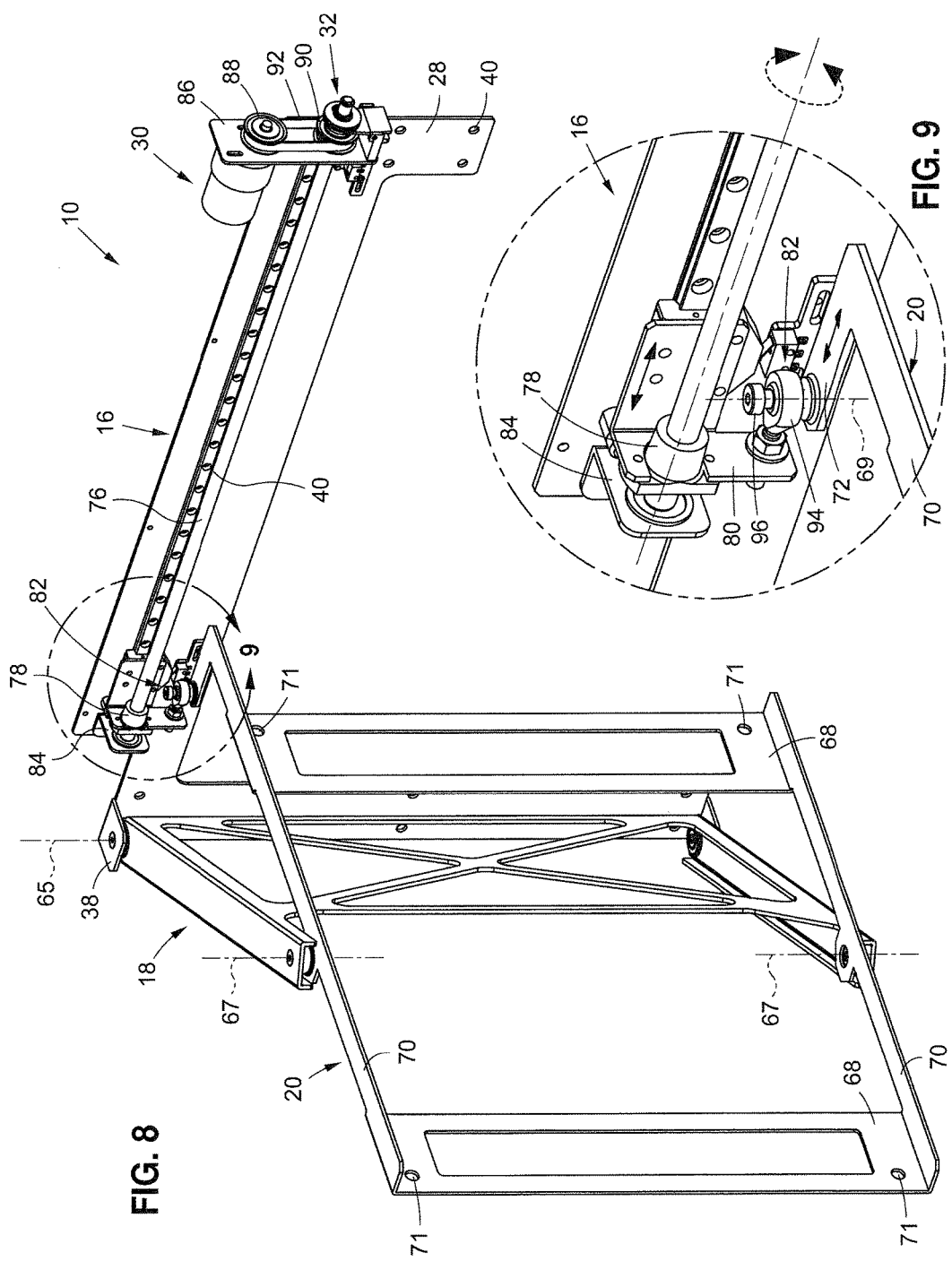

ENTERTAINMENT DISPLAY MOUNT

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to a motorized mount assembly for positioning a display (such as a TV monitor), and for controlling its positions through a combination of mechanical linkages made out of sheet metal frames, a linear motion controller and switches. The mount assembly is specifically designed to selectively provide a transitional support for mounting the display unit to a surface or support structure and for allowing a user to dynamically position the display at different viewing angles. The mount assembly is also equipped with a motor and a motion controller to accommodate viewing of the display from different aircraft locations.

2. Description of the Related Art

There is a desire within the airline travel industry to improve the overall flight experience for those traveling over a long distance and being confined within a small compartment for an extended period. Thus, it is common for an aircraft carrier to enhance the passenger experiences by offering, in addition to food and drinks to the passengers, different modes of entertainment during the flight. While on flight, it is customary for carriers to offer different classes of services, e.g., economy, business class, first class, suite, etc., wherein the level of comfort or luxury may vary among the different classes. Economy class is typically the entry level class, which provides the passenger with a standard seat and limited food and beverage options. In recent years, many carriers have equipped economy class seats with display screens in the back of each seat or a facing bulkhead to provide entertainment to the passengers throughout the trip.

Relative to economy class, first class service offers a more luxurious passenger experience. Typically, in first class, the seats are wider, offer more legroom, and may be capable of reclining more than a standard economy seat. First class may also offer better food and drink options, with the food and drink typically being complimentary. Most first class cabins also include a display screen for each passenger, with the display screen typically being larger than the conventional economy class. Carriers may also offer additional benefits to first class passengers, such as streamlined boarding/disembarking, as well as hot towels for each passenger when departing or arriving at the destination to allow the first class passenger to feel fresh.

A development in the airline industry is the introduction of yet another class of service above standard first class, typically referred to as a "first class suite." In a first class suite, the passenger is provided with private space, wherein the suite is separated from the rest of the aircraft by standing dividers or partitioning walls. The suite typically includes a bed, a separate seat, a work table, a TV remote control, and a display, such as a television screen.

Although, first class suites provide a level of luxury and privacy, which may be unmatched in commercial aviation, one deficiency associated with many first class suites relates to are the mounting provisions of the display on the walls. In many instances, the display screen is mounted directly across from the seat, flush to the wall, such that when the passenger is sitting in the seat, the passenger can easily view contents on the display screen. However, passengers cannot typically view the display screen when they are lying on the bed or resting. In most cases, today the mount assembly, used to support the display screen to the walls of the first class suite, is typically has a fixed, rigid, immovable mounts adapted to account for the unique environmental and safety considerations, generally driven by FAA regulations and other restrictions associated with being on an aircraft. For instance, the display screen may be required to be mounted such that the display screen does not inhibit or interfere with any passenger, who may be evacuating the aircraft under emergency conditions. Furthermore, the mount assembly may be required to withstand extreme load conditions commonly experienced in an aircraft, e.g., forces during takeoff, landing, turbulence, etc.

Accordingly, there is a need for an improved motorized device for mounting display screen within the cabin of an aircraft, wherein the mount assembly is capable of allowing the display screen to position at different viewing angles, and for passengers to control its viewing positions and to selectively transition from one viewing position to another with ease and comfort. Various aspects of the present disclosure address these particular needs, and are being discussed in more detail below.

BRIEF SUMMARY

In accordance with one embodiment of the present disclosure, a mount assembly equipped with a transitional support is provided to securely mount a display to an aircraft compartment's mounting surface. The support assembly is comprised of a base support frame adapted to be fixedly secured to the mounting surface of the aircraft. A pivoting support frame is pivotally coupled to the base support frame, with the pivoting support frame and base support frame collectively defining a triangular frame construction with a pivot angle in between. The pivoting support frame moves relative to the base support frame between a first position (often referred as a take-off or stowed position) and a second position (often called a deployed position). As the pivot support frame transitions from the first position toward the second position, the corresponding pivot support angle increases. A carriage frame, which securely holds the display in place using four fasteners, forms a third leg of that triangle. In addition, the carriage frame is adapted to be engaged with the display by having a first attachment portion pivotally and translationably coupled to the base support frame and defining a carriage angle inbetween; and a second attachment portion pivotally coupled to the pivoting support frame. With such a triangular arrangement, the carriage moves relative to the base support frame between a stowed position and a deployed position, with the carriage angle increasing as the carriage transitions from the stowed position to the deployed position. Transition of the carriage from the stowed position toward the deployed position causes the pivoting support frame to transition from the first position toward the second position. This trio support assembly (the carriage frame, the base support frame, and the pivot support frame), thus, virtually forms a motion triangle at any point of time.

With such support mount assembly, a passenger or a user can easily move the display for viewing from several different locations, such as a seat location, as well as a separate couch or bed location.

The carriage angle may be approximately zero degrees when the carriage frame is in the stowed position. The carriage angle may be approximately ninety degrees when the carriage frame is in the fully-deployed position.

The pivoting support frame and base support frame may be specifically configured and adapted to support a load of at least up to 200 lbs. applied to an end-portion of the pivoting support frame opposite the base support frame, when the pivoting support frame is in the second (deployed) position.

The two support frames (pivoting and base) further comprise a motor in operative communication with the carriage and adapted to impart a motive force on the carriage for transitioning the carriage frame between the stowed position and the deployed position. The trio frame assembly may further comprise a clutch in operative communication with the motor and the carriage, the clutch being selectively transitional between an engaged position and a disengaged position. In the engaged position, the motor is operatively coupled to the carriage frame via the clutch, in the disengaged position, the motor is decoupled from the carriage. For passenger safety considerations, the clutch may be manually operated to disengage the carriage frame at any point of time when in operation moving between the deployed position and the stowed position. A drive shaft may be mechanically coupled to the motor and the carriage frame and adapted to transfer the rotary motion of the motor to the angular movement of the carriage frame. The transfer of rotary motion from motor to the drive shaft may be accomplished using one or more of the following means: (belt-driven, Acme screw driven or ball screw driven setups)

The display may include a display screen having a viewing area of at least up to twenty-four inches measured diagonally.

The carriage frame may include a rear support member, and a pair of support flanges extending from the rear support member in opposed relation to each other and adapted to engage with opposing end portions of the display.

According to another embodiment, a method is provided for dynamically supporting a display on a mounting surface. The method includes supporting the display in a generally coplanar position relative to the mounting surface using a transitional support assembly having a base support attached to the mounting surface and having a carriage frame moveable relative to the base support between a stowed position and a deployed position. When a user sends an input signal to the motor, the motor starts and in turn moves a nut on a drive shaft. The carriage frame, being in constant operative communication with the nut on the drive shaft, transitions the carriage frame from a stowed position to a deployed position, which in turn causes the display to rotate and position itself generally perpendicular to its mounting surface.

According to yet another embodiment there is a provision for a living space, a quarter, or an apartment suite having vertical walls, defining a flat mounting surface. A motorized device, as described herein, is mounted on the mounting surface, to enable attachment of a display via the three-frame support assembly.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which:

FIG. 8 is an upper perspective view of the display mount assembly shown in the deployed position; and FIG. 9 is an enlarged upper perspective view of the interconnection between the carriage frame and the base support frame, which allows for pivoting and translation of the carriage frame relative to the base support frame.

Common reference numerals are used throughout the drawings and the detailed description to indicate the same elements.

DETAILED DESCRIPTION

The detailed description set forth below in connection with the appended drawings is intended as a description of certain embodiments of a display mount assembly for dynamically supporting and positioning a display. While the following paragraphs describe a preferred implementation in an aircraft, it is understood that mount assembly, devices, techniques, and methods may be used in other applications and environments, such as other vehicles, for instance trains, cruise ships, buses recreational vehicles, cars, minivans (e.g., rear entertainment displays), motor homes, food trucks (for displaying a menu), etc. It is also contemplated for use in conventional display mounting applications, such as in a room of a home or an office or other location, e.g., hotel, motel, class room, hospital, wherein it may be desirable to routinely transition a display between stowed and deployed positions. The description therefore sets forth the various structure and/or functions in connection with the illustrated embodiments, but it is to be understood, that the same or equivalent structure and/or functions may be accomplished by different embodiments that are also intended to be within the scope of the present disclosure. It is further understood that the use of relational terms such as first and second, and the like are used solely to distinguish one entity from another without necessarily requiring or implying any actual such relationship or order between such entities.

Figure 1:
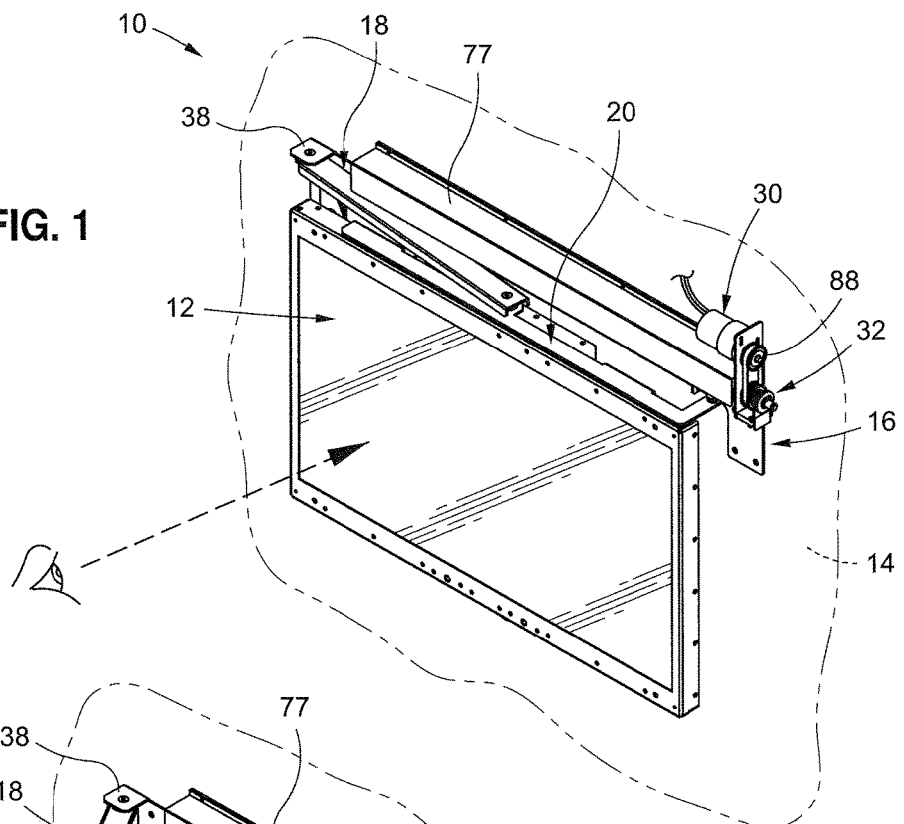
FIG. 1 is an upper perspective view of a display mount assembly for supporting a display onto a mounting surface, the frame support assembly is being shown in a stowed position.

Various aspects of the present disclosure are directed toward a display mount assembly 10 for dynamically supporting a display 12 on a mounting surface 14 located within the cabin of an aircraft (see FIG. 1). The mount assembly 10 is specifically configured and adapted to enable a passenger to selectively position the display 12 in a variety of different viewing positions. Such adaptability may be particularly advantageous in first class cabins, or private aircraft compartments, wherein a passenger may be provided with ample space not only to sit in a seat and view the display 12, but also to lie down on a separate couch or bed and simultaneously view the display 12. To accommodate the passenger, the display 12 may be selectively transitioned between a first position (for viewing the display 12 from the seat) and a second position (for viewing the display 12 from the bed or couch) or vice versa. Thus, the display mount assembly 10 accommodates various physical location points from which the passenger may view the display 12.

As used herein, the term "display" is intended to broadly refer to a display screen, particularly a twenty-four inch display screen but other sized display screens, such as a computer monitor, a tablet computer, a smartphone or other over-sized display screens are within the scope of this disclosure.

Figure 2:
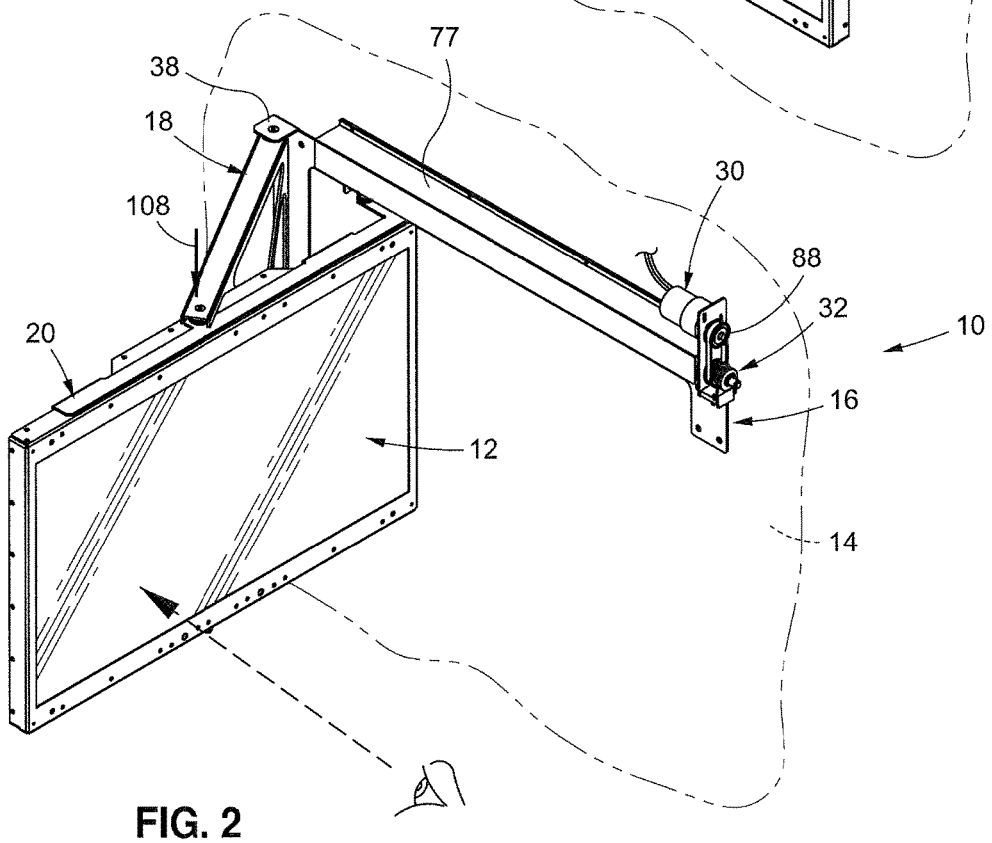
FIG. 2 is an upper perspective view of the display mount assembly in a deployed position.

According to one embodiment, the display support assembly 10 generally includes a base support frame 16, a pivoting support frame 18, and a carriage frame 20 (see FIG. 2). The base support frame 16 is adapted to be fixedly secured to the mounting surface 14 of the aircraft. The mounting surface 14 may include a wall or ceiling which at least partially defines a cabin or suite within the aircraft, the bulkhead, or any other rigid mounting structure adapted to support the display 12. As shown in the exemplary embodiment (see FIG. 5), the base support frame 16 includes a generally "C-shaped" member having a center arm 22 and two legs (one long leg 24 and one short leg 28), both extending generally perpendicularly relative to the center arm 22. The center arm 22 includes a proximal end portion 26 adjacent the long leg 24. The short leg is distal end portion 28 adjacent to 42. The short leg 28 may be smaller or larger relative to the remainder of the center arm 22 in order to accommodate mounting of a motor 30, a clutch 32, or other components, as described in FIG. 1 and more detail below. The long leg 24 includes a proximal end portion 34 adjacent to the center arm 22, and a distal end portion 36 extending away from the center arm 22. A pair of cantilever flanges 38 may extend generally perpendicularly from the long leg 24 at respective end portions thereof (see FIG. 5), the purpose of which will be described in more detail below.

The short leg 24 and the long leg 28 of center arm 22, include one or more apertures 40 formed therein, with the apertures 40 (see FIG. 5) being adapted to allow for mounting of the base support frame 16 to the mounting surface 14 of the aircraft. In this regard, the apertures 40 may accommodate a bolt, screw, nail, rivet, adhesive or other mechanical fastener known in the art. The apertures 40 may also be formed in the base support frame 16 for purposes of removing excess material therefrom in order to reduce the overall weight of the base support frame 16. In this respect, since the base support frame 16 is intended for use on an aircraft, reducing the overall weight may produce cost savings from reduced fuel consumption, particular when considering an entire fleet of carriers and aggregated over numerous flights for each aircraft in the fleet.

The short leg 28 defines a first lateral edge 42 and the long leg 24 defines an opposing second lateral edge 44 (see FIG. 5), with the base support frame 16 defining a length, $L_1$, (see FIG. 3) as the distance between the first lateral edge 42 and the second lateral edge 44. The center arm 22 also defines an upper edge 46, while the long leg 24 defines an opposing lower edge 48, with the base support frame 16 defining a height, $H_1$, as the distance between the upper edge 46 and the lower edge 48 (see FIG. 5). According to one embodiment, the length $L_1$ is approximately equal to 650 mm (i.e., 25.6 inches) and the height $H_1$ is approximately equal to 455 mm (i.e., 17.9 inches).

The base support frame 16 is generally formed from a high strength material, capable of supporting the display 12 in the various viewing positions, while also preferably being lightweight, to reduce its impact on fuel efficiency of the aircraft. Along these lines, all of the frame structures, including the base support frame 16 may be formed out of sheet metal stock with other materials, such as mild steel or alloy aluminum, known in the art.

Although the exemplary embodiment of the base support frame 16 defines a generally C-shaped structure (e.g., a center arm and two legs or arms), other embodiments of the base support frame 16 may be of L-shaped (may have only 2 arms) or a triangular shape (e.g., may have three arms). The support frame 16 may also include an additional arm extending between the distal end portions 42 of the short leg 28 and 48 of the long leg 24 (see FIG. 5) depending upon how its mounting surface 14 is configured.

The pivoting support frame 18 is pivotally coupled to the base support frame 16 just described earlier. The pivoting support frame 18 includes a first member 50, a parallel second member 52, and one or more support trusses 54 extending between the first and second members 50, 52 to provide structural support to the first and second members 50, 52 (see FIG. 5). The exemplary embodiment of the pivoting support frame 18 may include a pair of intersecting diagonal or angled support trusses 54, as well as an opposed pair of parallel support trusses 54, wherein the parallel support trusses 54 extend generally perpendicular to the first and second members 50, 52. The first member 50 may look like a channel section having a top wall 56 and a pair of sidewalls 58 extending along its two edges (of first member 50). Likewise, the second member 52 may also be a channel section having a bottom wall 60 extending between a pair of sidewalls 62 and defining an elongate channel along the second member 52. The elongate channels of the first and second members 50, 52 may be adapted to accommodate or at least partially conceal bearings or other hardware used to pivotally connect the pivoting support frame 18 to the base support frame 16, as well as the carriage frame 20 (see FIG. 4).

According to one embodiment, the pivoting support frame 18 is coupled to the base support frame 16 via a set of pivot bearings 64. The pivot bearings 64 may be placed within openings 66 pre-formed within the respective channel sections of the first and second members 50, 52 (see FIG. 5). Later, once the pivot bearings 64 are securely placed the two joints near openings 66 may then be operatively coupled to the flanges 38 located on either side of the long leg 24 of the base support frame 16.

Figure 3:
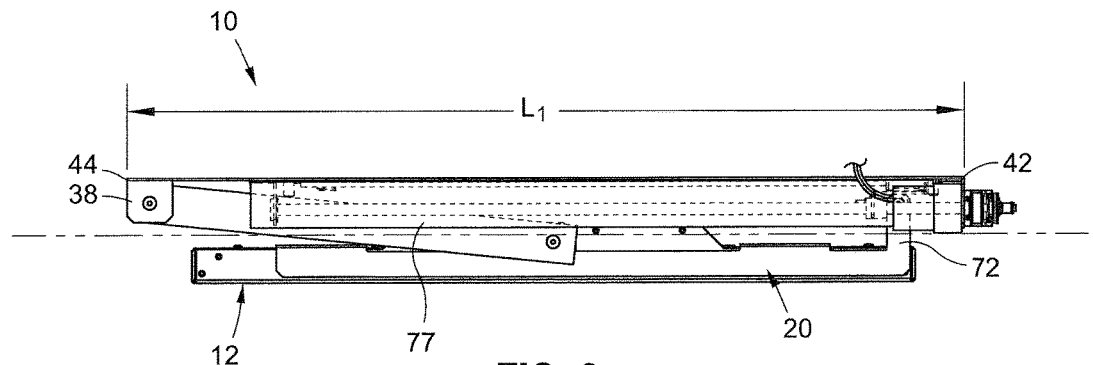
FIG. 3 is a top view of the display mount assembly in the stowed position.
Figure 4:
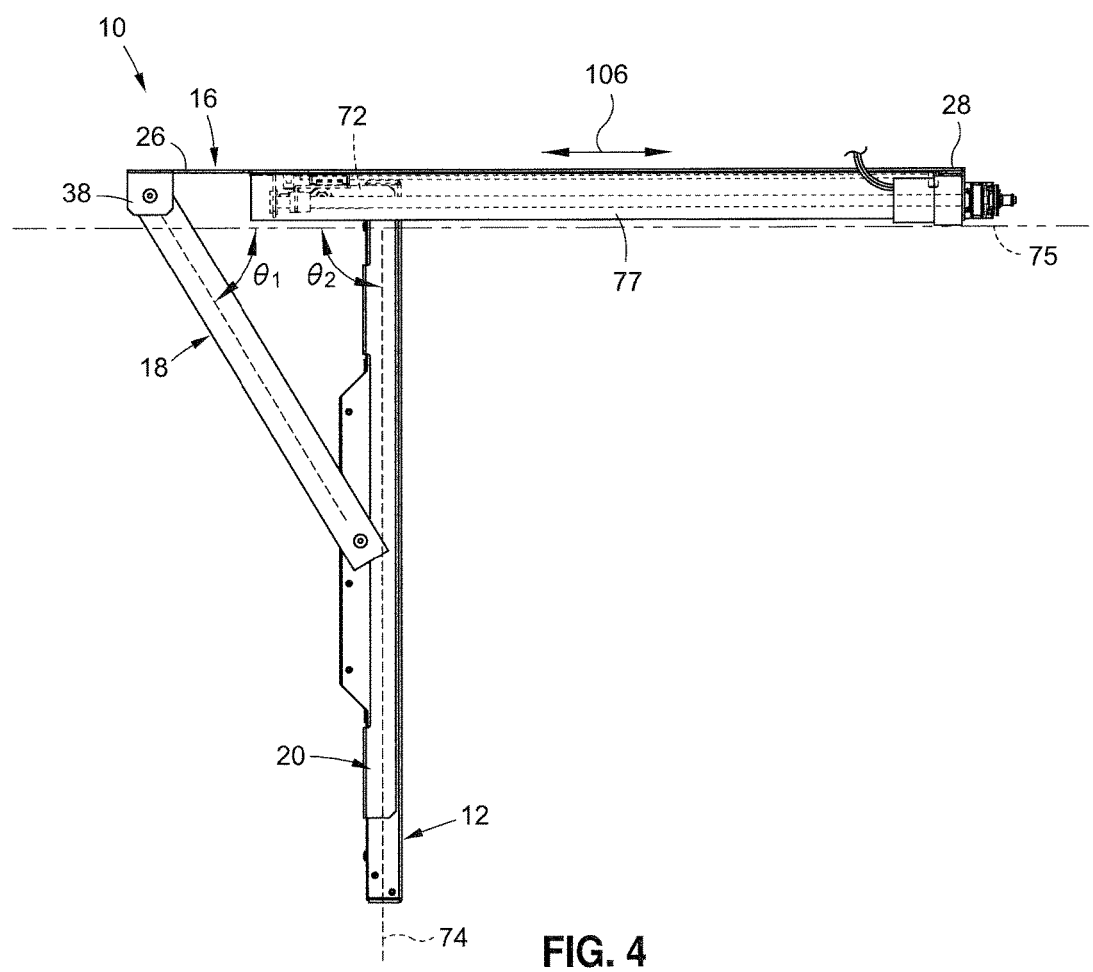
FIG. 4 is a top view of the display mount assembly in the deployed position.

The pivoting support frame 18 and base support frame 16 collectively define a pivot angle $\Theta_1$ in-between (see FIG. 4). The pivoting support frame 18 is adapted to be pinned (thus pivotable) relative to the base support frame 16 between a first position (see FIGS. 1, 3, and 6) and a second position (see FIGS. 2, 4, and 8), wherein the pivot angle $\Theta_1$ increases as the pivot support frame 18 transitions from the first position toward the second position. The pivoting support frame 18 pivots relative to the base support frame 16 about a first pivot axis 65 (see FIG. 8). As will be described in more detail below, the pivot support frame 18 is disposed in the first position when the display 12 is generally parallel to the mounting surface 14, and the pivot support frame 18 is disposed in the second position when the display 12 is generally perpendicular to the mounting surface 14.

The carriage frame 20 is pivotally coupled to the pivot support frame 18, as well as being pivotally and rotationally coupled to the base support frame 16. In this respect, the carriage frame 20 pivots relative to the pivot support frame 18 about a second pivot axis 67 (see FIG. 8) and relative to the base support frame 16 about a third pivot axis 69 (see FIG. 9), which translates linearly relative to the base support frame 16. The carriage frame 20 is securely fastened onto the display unit 12 along the four holes 71 (see FIG. 8) and moves together with the display 12 as the carriage frame 20 transitions relative to the base support frame 16. In the exemplary embodiment, the carriage frame 20 consists of a plurality of rear support members 68 and a perpendicular pair of support flanges 70, which extends perpendicular on opposed sides of support 68 and designed to fit over top and bottom-surfaces of the display 12 (see FIG. 8). As shown in FIG. 58, one of the support flanges 70 extends along the top surface of the display 12 and the other support flange 70 extends along the bottom surface of the display 12. The rear support members 68 include a plurality of apertures 71 for mounting the display 12 to the carriage frame 20 (see FIG. 8). For instance, bolts, screws, rivets, or other fastening hardware may be used to connect the display 12 to the carriage frame 20.

The carriage frame 20 includes a first attachment portion having an attachment arm 72, which is pivotally pinned to the base support frame 16 along the rod-end 94 eye axis 69 (see FIG. 9). When the attachment arm 72 stays pinned to the rod-end eye axis 69, the elongate carriage axis 74 further denotes a carriage angle $\Theta_2$ relative to an elongate base support frame axis 75 (see FIG. 4).

Figure 5:
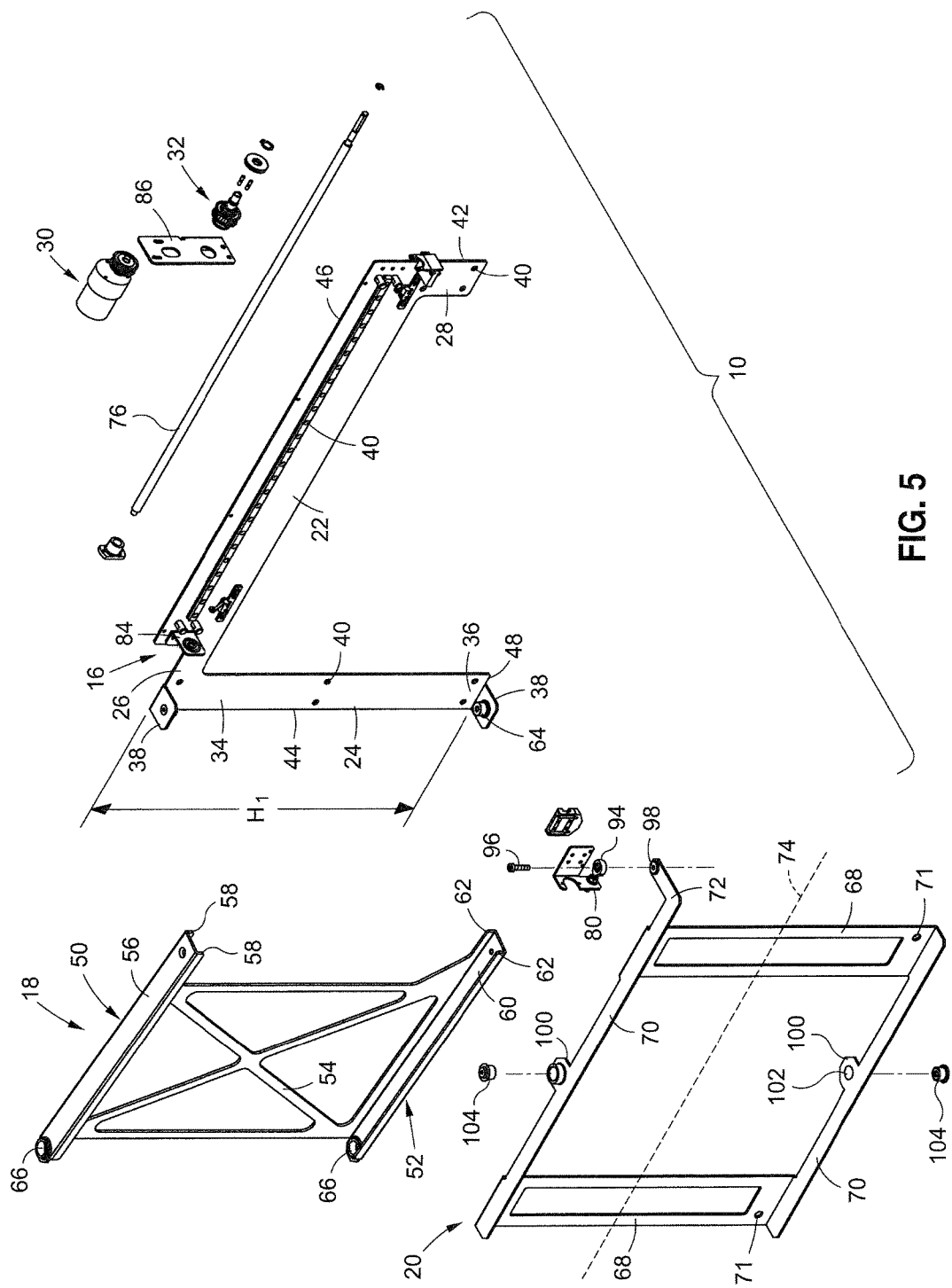
FIG. 5 is an upper perspective, exploded view of the display mount assembly.
Figure 6:
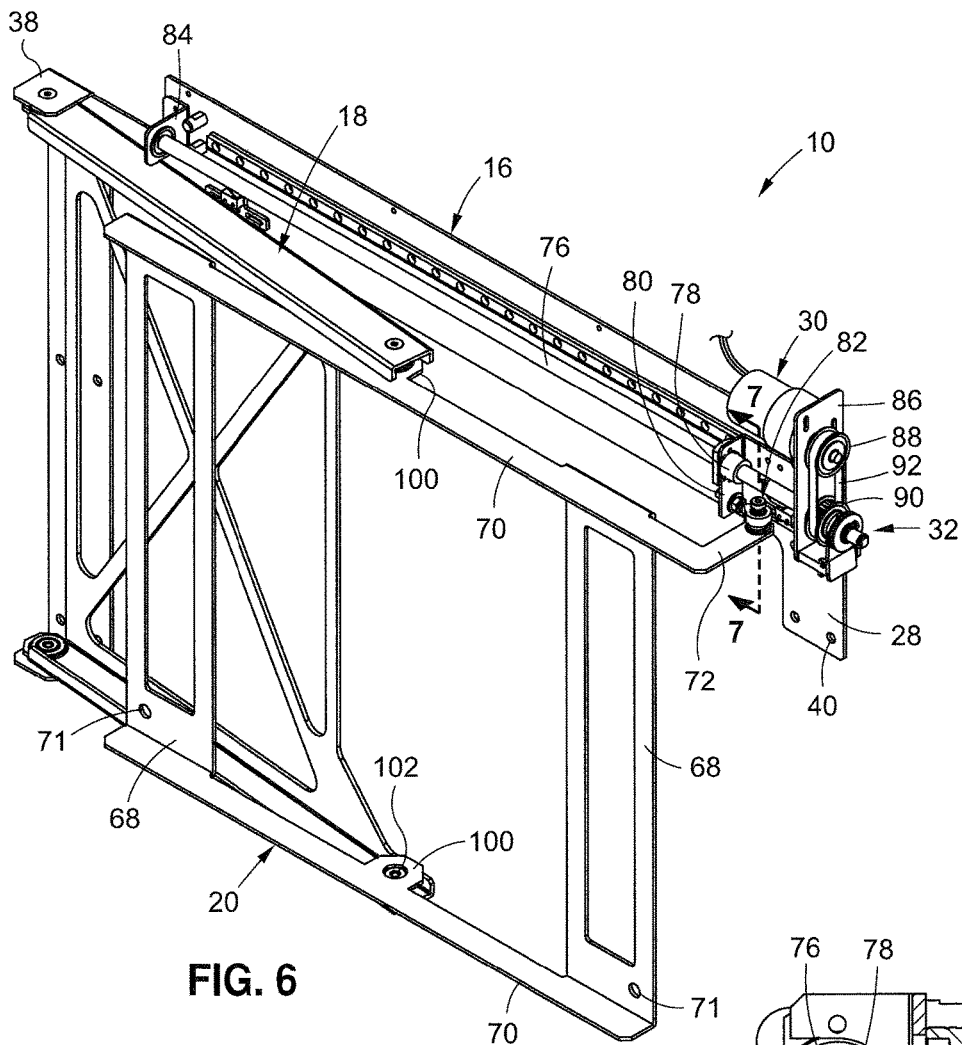
FIG. 6 is an upper perspective view of the display mount assembly shown in the stowed position (illustrated without the display for more convenient explanation)
Figure 7:
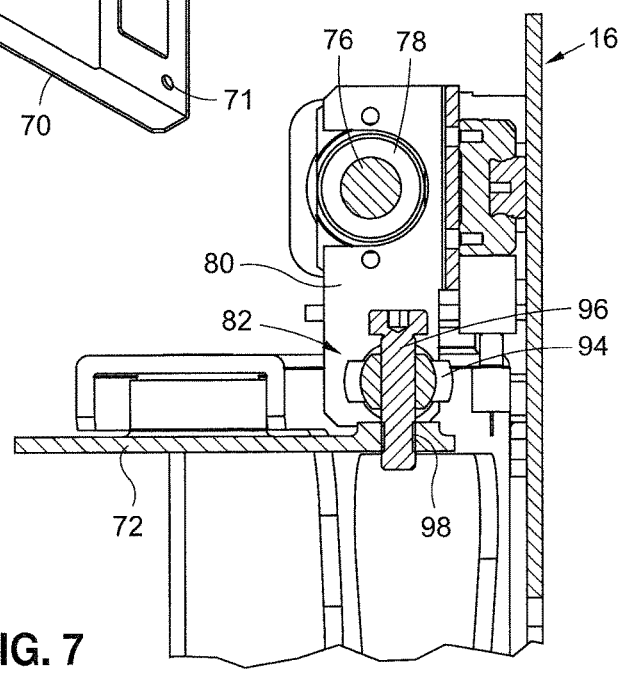
FIG. 7 is an enlarged cross sectional view of the interconnection between the carriage frame and base support frame which allows for pivoting and translation of the carriage frame relative to the base support frame.

According to one embodiment, the interconnection between the base support frame 16 and the carriage frame 20 is made possible via a drive shaft 76, a drive nut 78, a round end 94, a connecting linkage 80, and a pivot bearing 82 (see FIGS. 5 and 6). A protective cover 77 may extend over the drive shaft 76 and drive nut 78 to conceal the drive shaft 76 and drive nut 78 of the motion control assembly. The protective cover 77 is shown in FIGS. 1-4, and removed from FIGS. 5-9 for purposes of showing the inner-workings of the drive shaft 76, rod end 94, connecting linkage 80, and drive nut 78 more clearly. The drive shaft 76 is an elongate rod having helical threads extending externally with a pitch along the length thereof. The drive shaft 76 is axially mounted to the base support frame 16 via a set of mounting brackets 84, 86 (see FIG. 8). A motor 30 is coupled to the drive shaft 76 via a pair of pulleys 88, 90 and a drive belt 92 which is routed around the pulleys 88, 90. In particular, the motor 30 drives pulley 88, which in turn drives the drive belt 92, which drives pulley 90, which transfers rotational power to the drive shaft 76 (see FIG. 6). In this respect, the interconnection between the motor 30 and the drive shaft 76 allows for rotational power of the motor 30 to be transferred to the drive shaft 76 in some proportion depending upon the transfer ratio of the two systems.

The drive nut 78 is attached to the drive shaft 76 via threaded engagement therebetween, which allows the nut 78 to translate linearly along the length of the drive shaft 76 as the drive shaft 76 rotates. The connecting linkage 80 connects the drive shaft 76 to the pivot bearing 82 along the axis of its rotation and further connects to a threaded part of rod-end 94 a short distance offset from that axis. A threaded pin is passed through the eye of the rod end 94 pivotally connecting the attachment arm 72 through the opening 98 pre-formed in the attachment arm 72 (see FIG. 7).

The carriage frame 20 further includes a second attachment portion, which is pivotally coupled to the pivoting support frame 18 (see FIGS. 5, 6, 8). In the exemplary embodiment, the second attachment portion of carriage frame 20 includes a pair of circular tabs 100 formed in line with flange 70 but extending away from its respective edges (of flange 70). Each tab 100 of flange 70 includes an aperture 102 sized to receive a pivot bearing 104 for pivotally coupling the carriage frame 20 to the pivoting support frame 18.

The carriage frame 20 is specifically configured and adapted to provide a transitional motion relative to the base support frame 16 between a stowed position and a deployed position. FIGS. 1, 3, and 6 show the carriage frame 20 in the stowed position, while FIGS. 2, 4, and 8 show the carriage frame 20 in the deployed position. The passenger may selectively position the carriage frame 20 in the stowed or deployed position based on the location of the passenger for preferred viewing of the display 12. For instance, if the passenger is located in a seat, the preferred viewing angle relative to the display 12 may be with the carriage frame 20 in the stowed position. Alternatively, if the passenger is lying on a couch or bed, the preferred viewing angle relative to the display 12 may be with the carriage frame 20 in the deployed position. Of course, other arrangements of the aircraft cabin may result in the preferred viewing angle of the display 12 somewhat away from but close to those two desired positions. In any event, the transition of the carriage frame 20 between the stowed and deployed positions allows the passenger to selectively position the corresponding display 12 in a preferred viewing angle relative to the location of the passenger.

The pivotal movement of the carriage frame 20 relative to the base support frame 16 may be characterized by the change in the carriage angle $\Theta_2$ (see FIG. 4). According to one embodiment, the carriage angle $\Theta_2$ increases as the carriage frame 20 transitions between the stowed position and the deployed position, with such transition of the carriage frame 20 from the stowed position toward the deployed position causing the pivoting support frame 18 to transition from the first position toward the second position, meaning, the pivot angle $\Theta_1$ also proportionally increases. Thus, when the carriage frame 20 is in the stowed position the carriage angle $\Theta_2$ is approximately zero degrees, and when the carriage frame 20 is in the deployed position, the carriage angle $\Theta_2$ is approximately ninety degrees.

The translatable (or linear) movement of the carriage frame 20 relative to the base support frame 16 may be characterized by the movement of the attachment arm 72 of the carriage frame 20 along the base support frame axis 75 (see FIG. 4). In this respect, the attachment arm 72 is moveable in the directions indicated by reference character 106 in FIG. 4. When the carriage frame 20 is in the stowed position, the attachment arm 72 of carriage is located adjacent the distal end portion 28 of the base support frame 16 (see FIG. 6). As the carriage frame 20 transitions from the stowed position toward the deployed position, the attachment arm 72 moves away from the distal end portion 28 and toward the proximal end portion 26 (see FIG. 4). The carriage frame 20 is further configured and sized such that while the carriage frame 20 is translating between the distal end portion 28 and the proximal end portion 26, the carriage frame is also pivoting relative to the pivot support frame 18 along the pivot axis 67.

In view of the intended use of the display mount assembly 10 on an aircraft, the support assembly 10, and its associated frames, specifically the base support frame 16, pivoting support frame 18, and carriage frame 20 are configured, sized and adapted to support all abuse, FAA safety, and dynamic loads, which may be applied thereto. In this respect, it is understood that the display mount assembly 10 and its underlying support structures will be used in a dynamic environment, meaning what an aircraft experiences during sudden movements, such as during takeoff, landing, and/or turbulence. The display mount assembly 10 and all of its associated frames are sized and adapted to support the display 12 in the stowed position, the deployed position, and any position therebetween during a flight. Furthermore, it is contemplated that loose items in the aircraft cabin may inadvertently strike the display 12 or the support device, or during use, it may be subject to abuse load such as child hanging on it, and for this reason, various synthesis implementations of the display mount assembly 10 are considered and its associated frame structures are sized and adapted to support a load of at least 200 lbs. applied to an end portion of the pivoting support frame 18 opposite the base support frame 16 when the pivoting support frame 18 is in the second position, e.g., a load applied in the general direction of arrow 108, as shown in FIG. 2.

According to one embodiment, the display mount assembly 10 includes motor 30 for providing the motive force required to transition the carriage frame 20 between the stowed and deployed positions. In one implementation, the mount assembly 10 further includes clutch 32 for selectively placing the motor 30 in operative communication with the drive shaft 76. The clutch 32 is selectively transitional between an engaged position and a disengaged position. In the engaged position, the clutch 32 is engaged with pulley 92 and operatively couples pulley 92 with drive shaft 76, which in turn, operatively couples the motor 30 and the carriage frame 20. When the clutch 32 is in the disengaged position, the clutch 32 is disengaged from pulley 92, which operatively decouples pulley 92 from drive shaft 76, which in turn operatively decouples the motor 30 from the carriage frame 20. In another embodiment, the clutch 32 is manually transitional between the engaged and disengaged positions, which would allow a passenger to manually transition the carriage frame 20 between the deployed position and the stowed position. Thus, in the event of a power loss, or if the aircraft is struck by lightning or during an emergency, or for any other safety considerations, the carriage frame 20 may be capable of being manually transitioned between the stowed and deployed positions. This may be particularly useful in the event passengers need to disembark the aircraft quickly, as the carriage frame 20 may be manually stowed away, if needed, and thus will not inhibit any passengers exiting of the aircraft.

According to one embodiment, the display mount assembly 10 is very light weight (e.g., approximately 8-10 lbs.), to mitigate the impact on fuel consumption of the aircraft. Furthermore, the interconnections between the base support frame 16, pivot support frame 18, carriage frame 20, and the configuration of the motor 30 allow mount assembly 10 to operate very quietly and smoothly.

With the basic structural features of the mount assembly 10 described above, the following discussion will focus on an exemplary usage of the same (display mount assembly 10). When the display assembly 10 is initially mounted to a mounting surface 14, a set of fasteners is advanced through a set of apertures 40 located in the base support frame 16 to connect it to the mounting surface 14 (see FIG. 5). The display assembly 10 may be mounted on an aircraft surface facing across a first viewing location (say facing across a passenger seat, or a chair). The attachment of those fasteners onto the compartment frames generally determines how much a display assembly 10 will be spaced, when fully deployed, from the head position when the passenger will be sleeping or lying on the couch/bed. In either situation, once mounted, the display 12 may be connected to the carriage frame 20 by advancing fasteners through the apertures 71 on the carriage frame 20.

During boarding of the aircraft, it is desirable for the carriage frame 20 to be in the stowed position so as not to impede the boarding passenger(s). Thus, the airline crew may ensure all frames and support assemblies installed on the aircraft are in the stowed position. Along these lines, in one embodiment, the motors 30 of each support assembly of display mount 10 may be controlled via the flight crew view a central controller to allow for ease in placing all frames and assemblies in the stowed positions.

Once onboard the aircraft, the passenger may view the display 12 from the first viewing location, with the preferred viewing angle of the display 12 from the first viewing location being with the carriage frame 20 in the stowed position. In this respect, no change is required of the position of the display 12. However, should the passenger decide to view the display from the second viewing location, it may be desirable to transition the carriage frame 20 from the stowed position to the deployed position. In this respect, the passenger may actuate the motor 30 by depressing a button or remote control in operative communication with the motor 30. As the motor 30 operates, the motor 30 rotates pulleys 88 and 90, which are operatively coupled via drive belt 92. Rotation of pulley 90 causes the drive shaft 76 to rotate, which in turn, causes the drive nut 78 to translate along the drive shaft 76. Such translation of the drive nut 78 causes the attachment arm 72 of the carriage frame 20 to also translate along the drive shaft 76. As the carriage frame 20 translates relative to the base support frame 16, the interconnection between the carriage frame 20 and the pivoting support frame 18 causes the carriage frame 20 to also pivot relative to the base support frame 16. According to one embodiment, when the carriage 20 transitions completely from the stowed position to the deployed position, the carriage frame 20 pivots approximately 90 degrees relative to the position of the carriage frame 20 in the stowed position. Should the passenger decide to go back to the first viewing location, the passenger may once again actuate the motor 30 to operate in a reverse mode, which reverses the rotation of the pulleys 88, 90, which reverses the corresponding rotation of the drive shaft 76. The reversed rotation of the drive shaft 76 causes the drive nut 78 to translate in an opposite direction, which causes the carriage frame 20 to translate and pivot relative to the base support frame 16 in a directions opposite to the translational and pivot directions described above in relation to transition of the carriage frame 20 from the stowed to the deployed positions.

At any time during use of the display mount assembly 10, the passenger may operatively decouple the motor 30 by transitioning the clutch 32 from the engaged position to the disengaged position. According to one embodiment, the clutch 32 is transitioned from the engaged position to the disengaged position by simply manually pulling the clutch 32 lever arm away from pulley 90. Conversely, the clutch 32 is transitioned from the disengaged position to the engaged position by manually pushing the clutch 32 lever arm toward pulley 90.

As discussed previously, the description herein describes a preferred implementation of the display mount assembly 10 for use in an aircraft, but it is understood that the display mount assembly 10 may be used in other applications and environments. For instance, the display mount assembly 10 can also be used in other transport vehicles, such as trains, buses, cruise ships, recreational vehicles, cars, minivans (e.g., rear entertainment displays), motor homes, food trucks (for displaying a menu), etc. It is also contemplated that the adaptability and robustness of the display mount assembly 10 may also find appeal in conventional display mounting applications, such as in a room of a home or office or other location, e.g., hotel, motel, class room, hospital, wherein it may be desirable to routinely transition a display between stowed and deployed positions.

The particulars shown herein are by way of example only for purposes of illustrative discussion, and are not presented in the cause of providing what is believed to be most useful and readily understood description of the principles and conceptual aspects of the various embodiments of the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A support assembly for mounting a display on a mounting surface, the support assembly comprising:
   a base support frame adapted to be secured to the mounting surface;
   a pivoting support frame pivotally coupled to the base support frame, the pivoting support frame and base support frame collectively defining a pivot angle, therebetween, the pivoting support frame being transitional relative to the base support frame between a first position and a second position, the pivot angle increasing as the pivoting support frame transitions from the first position toward the second position; and
   a carriage frame adapted to be engaged with the display, the carriage frame having a first attachment portion pivotally and translatably coupled to the base support frame and defining a carriage angle therebetween, and a second attachment portion pivotally coupled to the pivoting support frame;
   the carriage frame being transitional relative to the base support frame between a stowed position and a deployed position, the carriage angle increasing as the carriage frame transitions from the stowed position to the deployed position, transition of the carriage frame from the stowed position toward the deployed position causing the pivoting support frame to transition from the first position toward the second position.

2. The support assembly recited in claim 1, wherein the carriage angle is approximately zero degrees when the carriage frame is in the stowed position.

3. The support assembly recited in claim 1, wherein the carriage angle is approximately ninety degrees when the carriage frame is in the deployed position.

4. The support assembly recited in claim 1, wherein the pivoting support frame and base support frame are specifically configured, sized and adapted to support a load of at least 200 lbs. applied to an end portion of the pivoting support frame opposite the base support frame when the pivoting support frame is in the second position.

5. The support assembly recited in claim 1, further comprising a motor in operative communication with the carriage frame, the motor being sized and adapted to impart a motive force on the carriage frame for transitioning the carriage frame between the stowed position and the deployed position.

6. The support assembly recited in claim 5, further comprising a clutch in operative communication with the motor and the carriage frame, the clutch being selectively transitional between an engaged position and a disengaged position, in the engaged position, motor being operatively coupled to the carriage frame via the clutch, in the disengaged position, the motor being decoupled from the carriage frame.

7. The support assembly recited in claim 6, wherein:
   the clutch is manually transitional between the engaged and disengaged positions; and
   the carriage frame is manually transitional between the deployed position and the stowed position.

8. The support assembly recited in claim 5, further comprising a drive shaft operatively coupled to the motor and the carriage frame and adapted to transfer movement of the motor to movement of the carriage frame.

9. The support assembly recited in claim 1, wherein the display includes a display screen of at least twenty-four inches.

10. The support assembly recited in claim 1, wherein the carriage frame includes a rear support member, and a pair of support flanges extending from the rear support member in opposed relation to each other, sized and adapted to engage with opposing end portions of the display.

11. A support for mounting a display to a mounting surface, the support comprising:
    a base support frame adapted to be secured to the mounting surface;
    a carriage frame adapted to be engaged with the display, the carriage frame having a first attachment portion pivotally and translatably coupled to the base support frame and defining a carriage angle therebetween, the carriage frame being transitional relative to the base support frame between a stowed position and a deployed position, the carriage angle increasing as the carriage frame transitions from the stowed position to the deployed position;
    a motor operatively coupled to the carriage frame and adapted to provide a motive force to transition the carriage frame between the stowed position and the deployed position;
    a drive shaft operatively coupled to the motor and the carriage frame and adapted to transfer movement of the motor to movement of the carriage frame; and
    a drive nut attached to the drive shaft via threaded engagement therebetween in which the drive nut translates linearly along the drive shaft as the drive shaft rotates.

12. The support recited in claim 11, wherein the carriage angle is approximately zero degrees when the carriage frame is in the stowed position.

13. The support recited in claim 11, wherein the carriage angle is approximately ninety degrees when the carriage frame is in the deployed position.

14. The support recited in claim 11, wherein the carriage frame and base support frame are specifically configured and adapted to support a load of at least 200 lbs. applied to portion of the carriage frame spaced from the base support frame.

15. The support recited in claim 11, further comprising a clutch in operative communication with the motor and the carriage frame, the clutch being selectively transitional between an engaged position and a disengaged position, in the engaged position, motor being operatively coupled to the carriage frame via the clutch, in the disengaged position, the motor being decoupled from the carriage frame.

16. The support recited in claim 15, wherein:
    the clutch is manually transitional between the engaged and disengaged positions; and
    the carriage frame is manually transitional between the deployed position and the stowed position.

17. The support recited in claim 11, wherein the display includes a display screen of at least twenty-four inches.

18. The support recited in claim 11, wherein the carriage frame includes a rear support member, and a pair of support flanges extending from the rear support member in opposed relation to each other and adapted to engage with opposing end portions of the display.

19. A method of supporting a display on a mounting surface, the method comprising:
supporting the display in a generally coplanar position relative to the mounting surface using a transitional support assembly including a base support attached to the mounting surface and a carriage moveable relative to the base support between a stowed position and a deployed position;
receiving an input signal from a user; and
actuating a motor in operative communication with the carriage in response to receipt of the input signal to transition the carriage from the stowed position to the deployed position, the display being positionable in perpendicular relation to the mounting surface by translating the carriage in a direction parallel to the mounting surface and rotating the display about an axis perpendicular to said direction.

20. The support recited in claim 11, wherein the carriage frame is configured such that movement of the carriage frame between the stowed position and the deployed position includes a translational component in a direction substantially parallel to the mounting surface, and a rotational component associated with rotation of the carriage frame about an axis substantially perpendicular to said direction.

* * * * *